(12) United States Patent
Hong et al.

(10) Patent No.: US 6,822,189 B2
(45) Date of Patent: Nov. 23, 2004

(54) METHOD OF LASER MARKING AND APPARATUS THEREFOR

(75) Inventors: Minghui Hong, Singapore (SG); Yongfeng Lu, Singapore (SG)

(73) Assignee: Data Storage Institute, Singapore (SG)

( * ) Notice: Subject to any disclaimer, the term of this patent is extended or adjusted under 35 U.S.C. 154(b) by 0 days.

(21) Appl. No.: 10/090,409

(22) Filed: Mar. 4, 2002

(65) Prior Publication Data
US 2003/0071020 A1 Apr. 17, 2003

(30) Foreign Application Priority Data
Oct. 16, 2001 (SG) ..................... 200106342-9

(51) Int. Cl.[7] ............................... B23K 26/36
(52) U.S. Cl. ..................... 219/121.69; 219/121.68; 427/596
(58) Field of Search .............. 219/121.68, 121.69; 427/596; 118/50.1

(56) References Cited

U.S. PATENT DOCUMENTS

| | | | | |
|---|---|---|---|---|
| 4,213,704 A | * | 7/1980 | Burns et al. | |
| 4,743,463 A | | 5/1988 | Ronn et al. | |
| 4,814,259 A | * | 3/1989 | Newman et al. | |
| 4,987,006 A | * | 1/1991 | Williams et al. | |
| 5,156,938 A | * | 10/1992 | Foley et al. | |
| 5,198,843 A | * | 3/1993 | Ito et al. | |
| 5,980,101 A | * | 11/1999 | Unternahrer et al. | |
| 6,180,915 B1 | * | 1/2001 | Sugioka et al. | 219/121.69 |
| 6,440,503 B1 | * | 8/2002 | Merdan et al. | 427/596 |
| 6,442,974 B1 | * | 9/2002 | Paananen et al. | |

FOREIGN PATENT DOCUMENTS

| | | |
|---|---|---|
| CA | 1105093 | 7/1981 |
| EP | 0 002 738 A1 | 7/1979 |
| FR | 2666759 A1 * | 3/1992 |
| WO | WO 95/25639 | 9/1995 |
| WO | WO-00/64682 A1 * | 11/2000 |

* cited by examiner

Primary Examiner—Geoffrey S. Evans
(74) Attorney, Agent, or Firm—Fish & Richardson P.C.

(57) ABSTRACT

A method of laser marking, suitable for the marking of hard transparent materials without causing microcracking, includes arranging a sample of target material and a sample of markable material such that they are spaced apart; directing irradiation having an energy fluence above the ablation threshold of the target material onto the target material so that some of it is ablated and thrown onto a surface of the markable material; and subjecting the surface of the markable material to irradiation having an energy fluence below the ablation threshold of the markable material to induce an interaction between the ablated material and the surface which marks the surface of the ablated material. Different colours of mark can be obtained by using different target materials, and the tone of the mark can be controlled as desired. Apparatus for implementing the method permits control of the method in real time.

23 Claims, 5 Drawing Sheets

1mm

— 5 mm

— 2 mm

— 5 mm

— 5 mm

METHOD OF LASER MARKING AND APPARATUS THEREFOR

The present invention relates to a method of laser marking, especially but not exclusively laser marking of hard transparent materials, and also to apparatus suitable for carrying out the method.

Permanent marking and printing of a wide range of materials is common practice, and a variety of techniques are used. Materials such as hard transparent materials including glasses have a high level of hardness and are brittle, so marking methods for these materials need to take account of these properties.

A conventional method of marking hard materials is to use a mechanical tool to write directly onto the surface of the material by surface scribing. However, a problem with using this method on glass, for example, is that many microcracks form along the edges of the scribing lines. These microcracks weaken the material and reduce the quality of the marking. Another technique uses laser ablation. At high levels of laser energy fluence ("fluence" being defined as laser energy delivered per irradiated area), the laser energy causes a breakdown of the hard material so that particles of the material are removed and thrown out from the material, leaving a hole or a pit. Ablation has been used to mark the surface of glass and also to mark the interior of glass bodies. However, this technique also causes microcracks around the marked areas, owing to heating and thermal stresses in the material caused by absorption of the laser energy. Marking which is free from microcracks has been demonstrated on glass by using a fluoride excimer laser for ablation, but the laser source is costly, has poor beam quality giving poor marking definition, and has a complicated configuration.

U.S. Pat. No. 6,238,847 and U.S. Pat. No. 6,075,223 propose laser-based marking methods for marking of glass, ceramic, plastics and metals. A layer of marking material is applied to the surface of a substrate, and irradiated with a laser beam in accordance with the desired pattern. The irradiated parts are heated by the irradiation and adhere or chemically bond to the surface of the substrate. The non-irradiated parts are then removed to leave the pattern on the substrate surface. However, when used to mark glass, microcracks can be formed at high laser energy levels. U.S. Pat. No. 6,238,847 suggests that the risk of cracking can be reduced if the substrate and marking material are preheated with a first laser beam before the marking material is adhered with a second laser beam.

Therefore, there is a requirement for a method of laser marking which does not cause microcracking, and/or does not require any additional steps to reduce the risk of microcracking, such as preheating, and/or does not require the application of a separate layer of marking material, and/or is simple and cost-effective.

Accordingly, a first aspect of the present invention is directed to a method of laser marking comprising:

arranging a sample of target material spaced apart from a sample of markable material;

directing irradiation having an energy fluence above the ablation threshold of the target material onto the target material such that at least some of the target material is ablated and thrown onto a surface of the markable material; and subjecting said surface of the markable material to irradiation having an energy fluence below the ablation threshold of the markable material to induce an interaction between the ablated material and the surface which marks the surface with the ablated material.

The method permits the marking of materials with reduced or even without the formation of microcracks. The fluence of irradiation to which the markable material is subjected is below its ablation level, so the material is protected from damage. The ablation of the target material can be achieved at fluences less than the ablation threshold of the markable material, so besides protection of the markable material, the entire method can be carried out at relatively low fluence levels, which is cost-effective. Also, the ablation of the target material throws the ablated material onto the markable material surface in a localised fashion so the ablated material can be directly deposited on the surface in accordance with the desired pattern, rather than needing to be applied in a layer over the whole surface.

In a preferred embodiment, the markable material is arranged with respect to the target material such that the irradiation is directed via the markable material and onto the target material. This arrangement can be used so that the same beam of irradiation both ablates the target material and subjects the markable material surface to irradiation to mark it. The ablated material is thrown onto the back surface of the markable material (with respect to the direction of propagation of the irradiation) at the point where the irradiation passes through the markable material, so that newly incoming irradiation encounters the surface and previously ablated material thereon before reaching the target material to cause further ablation. Use of the above arrangement means that the markable material may be substantially transparent to the irradiation. The method is therefore especially suitable for transparent hard materials such as glass.

Advantageously, the irradiation is provided as a train of pulses. The markable material is hence not subjected to continuous irradiation, and any heat building up in the material from absorption of the irradiation has an opportunity to dissipate between pulses. Examples of suitable pulse durations are tens and hundreds of nanoseconds. Many sources of pulsed irradiation are available, such as Q-switched lasers, including Nd:YAG Q-switched lasers.

The ablation and the interaction may be achieved by the same pulse of irradiation, if the spacing between the target material and the markable material, and the duration of the pulse, are such that the ablated material can reach the surface of the markable material before the tail end of the pulse has passed through the markable material. Therefore, the interaction to mark the surface occurs before further ablated material is deposited. Alternatively, the ablation and interaction may be achieved by different pulses of irradiation.

The method may further comprise monitoring the fluence of the irradiation, and preferably then further comprises controlling the fluence of the irradiation in response to the monitoring. To ensure that the markable material is successfully marked without being damaged, the fluence should be below the ablation threshold for the markable material and above the ablation threshold for the target material. By monitoring and controlling the fluence, it can be maintained at a suitable level at all times.

The method may further comprise detecting and analysing the amount of irradiation reflected and scattered from the surface, the target material and the ablated material, and advantageously then further comprises adjusting the spacing between the target material and the markable material in response to the analysis of the reflected and scattered irradiation to determine that the ablated material is being thrown onto the surface of the markable material. If the spacing is too large, the ablated material has insufficient kinetic energy to reach the surface, so that marking does not occur. However, the detected irradiation can be shown to have certain identifiable features when the ablated material is reaching the surface and interacting, so detection and analysis of the irradiation can be used as an indicator that the method is being carried out successfully. Active control of the spacing in response to the detection and analysis therefore assists in keeping the method working properly.

Advantageously, the method further comprises setting the spacing between the target material and the markable material so that the amount of ablated material thrown onto the surface of the markable material is sufficient to mark the surface with a mark of a desired tone. A larger amount of ablated material gives a mark of a darker tone on the markable material. The ablated material has a spread of kinetic energies as it is thrown from the target material, and hence a spread of traversable distances, so altering the spacing changes the proportion of the ablated material which reaches the surface to contribute to the mark. This gives control over the tone.

Alternatively or additionally, the method further comprises setting the fluence of the irradiation so that the amount of target material which is ablated and thrown onto the surface of the markable material is sufficient to mark the surface with a mark of a desired tone. A higher fluence will ablate more target material and impart more kinetic energy to it, so that more ablated material reaches the markable material to contribute to the mark and increase its tone.

The method may further comprise moving the directed irradiation and the sample of markable material relative to one another so as to mark the surface of the markable material in accordance with a desired pattern.

The target material may be one of copper, silicon, aluminium, silver, chromium, titanium, tungsten and other metal, semiconductor or other solid substrates. Different materials give different colours of marking.

The irradiation may be optical irradiation, for which there are plentiful sources.

A second aspect of the present invention is directed to apparatus for laser marking a sample of markable material, comprising:
a sample of target material; and
a irradiation source operable to generate irradiation to:
ablate at least part of the target material so that the ablated material is thrown onto the surface of a sample of markable material spaced apart from the sample of target material; and
irradiate the surface of the sample of the markable material to induce an interaction between the ablated material and the surface which marks the surface with the ablated material.

This apparatus is suitable for carrying out the method according to the first aspect of the present invention.

Preferably, the apparatus further comprises a controller operable to control at least the operation of the irradiation source. Automated control of the apparatus gives faster and more accurate marking.

The apparatus may further comprise scanning apparatus controlled by the controller and operable to provide relative movement between the irradiation and the sample of markable material so that the surface can be marked in accordance with a desired pattern. Preferably, the scanning apparatus comprises a galvanometer-based beam scanner operable to scan the irradiation. A galvanometer scanner can provide fast, accurate and repeatable movement of a beam of irradiation.

The apparatus may further comprising an energy meter operable to measure the energy of the irradiation and pass the measurements to the controller, the controller being operable to control the irradiation source in response to the measurements. This allows for the energy fluence of the irradiation to be continuously controlled to ensure that it stays below the ablation threshold of the markable material and above the ablation threshold of the target material.

In a preferred embodiment, the apparatus further comprises an adjustable mount operable to adjust the spacing between the sample of target material and the sample of markable material. Control of the spacing gives control over the tone of the mark. It is also important for operation of the apparatus in that the spacing may need to be adjusted to ensure that it is small enough for ablated material to reach the markable material.

Advantageously, the apparatus further comprises a detector operable to detect irradiation scattered and reflected from the surface of the markable material, the target material and the ablated material and pass a detection signal to the controller, the controller being operable to control the adjustable mount in response to the detection signal. The signal indicates when the spacing is small enough, so the spacing can be automatically maintained at an appropriate distance.

Suitably, the irradiation source is operable to generate optical irradiation. Such sources are plentiful.

Examples of embodiments of the aspects of the present invention will now be described, with reference to the accompanying drawings, in which:

FIG. 1 shows an example of an embodiment of apparatus suitable for carrying out laser marking in accordance with an example of the first aspect of the present invention.

Figure 1:
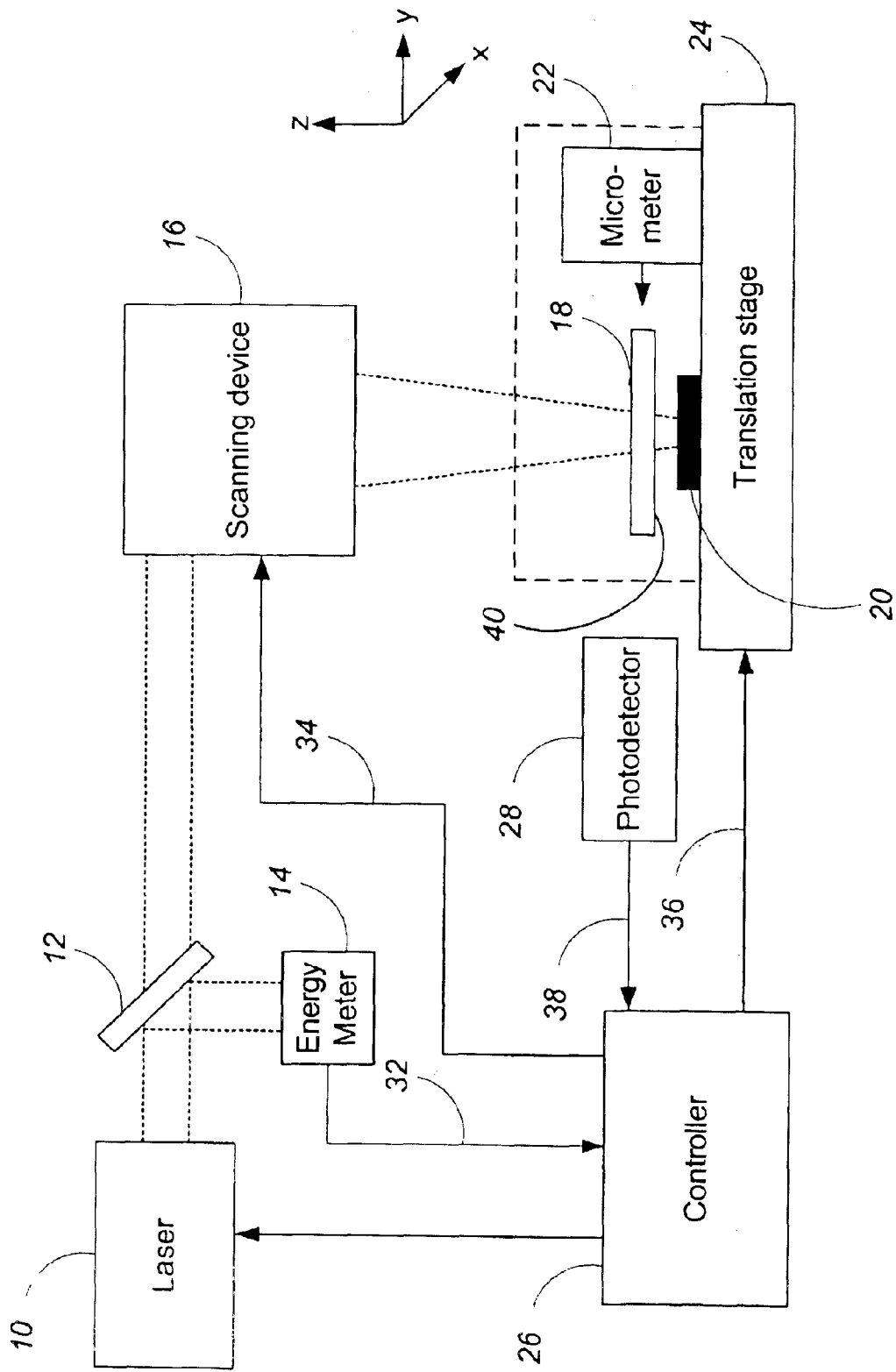
FIG. 1 shows an example of an embodiment of apparatus according to a second aspect of the present invention.

A source of irradiation 10 comprises a laser operable to generate a pulsed output. The laser is a frequency-doubled diode-pumped Q-switched neodymium:yttrium alumiunium garnet (Nd:YAG) laser, producing pulses of 100 ns duration at a 10 kHz repetition rate and a wavelength of 532 nm. The laser beam path followed by the generated pulses is shown by the dotted lines in FIG. 1. A beam splitter 12 is arranged in the beam path, and is coated to reflect 5% of the power of the laser output and transmit the remaining 95%. A beam scanning device 16 is arranged in the beam path downstream of the beam splitter 12, and contains focussing optics and beam steering optics driven by a drive system.

A motorised xy translation stage 24 giving movement in the xy plane has a micrometer 22 mounted on it, which provides movement in the z direction. A sample of target material 20 sits on the translation stage, the whole being arranged so that the laser beam is incident on the target material after being directed by the beam scanning device 16.

A controller 26 is an electronic or computerised controller, for example a general purpose controller such as a PC, which may be programmable and/or adapted to receive pre-programmed memory modules. The controller 26 is connected to the irradiation source 10 by means of a physical or remote connection 30, for example a cable, and is operable to control the irradiation source function, including laser output power.

An energy meter 14 is located to receive the 5% of the laser output reflected from the beam splitter 12, and measures the energy of the reflected output. A connection 32, for example a cable, connects the energy meter 14 to the controller 26 so that the controller 26 can receive information about the output of the irradiation source 10. The controller 26 may be configured to automatically calculate the total laser output energy from the measured 5%.

A further connection 34, for example a cable, connects the controller 26 to the beam scanning device 16. The controller 26 can send scan information to the beam scanning device 16 to control how the laser beam is moved and scanned. An additional connection 36 connects the controller 26 with the translation stage 24, so that the controller 26 can adjust the position of the translation stage 24 and the items held thereon relative to the incident laser beam. Additionally via this connection 36 the controller can operate the micrometer 22.

Finally, a time-resolved photodetector is situated adjacent to the translation stage 24 to detect light scattered and reflected from the target material and its environs (as will be discussed further subsequently). The photodetector can pass a signal in response to detected light to the controller by means of a connection 38.

To operate the apparatus so as to mark or print a sample of markable material, the sample of target material is selected to provide the desired colour of printing. A sample 18 of markable material which is to be printed is mounted on the micrometer 22 and held above of the target material but spaced apart therefrom. Movement of the micrometer 22 adjusts the spacing between the markable material and the target material. The markable material 18 is positioned so that its surface 40 which is to be printed faces towards the target material 20 and away from the beam scanning device 16. With respect to the direction of propagation of the laser beam the surface 40 can be considered as the back surface of the markable material 18. The markable material 18 is transparent at the wavelength emitted by the irradiation source 10.

The irradiation source 10 is operated to generate a train of pulses in the form of a beam. The beam (mostly) passes through the beam splitter and proceeds to the beam scanning device 16, where it is focussed to give a suitable spot size at the surface of the target material 20, and also directed towards the target material 20. The spot size is determined by the necessity to achieve a laser energy fluence at the target material which is above the ablation threshold for the target material 20, so that the target material 20 ablates when irradiated. The fluence is defined as laser energy per irradiated area, so depends both on the focussed spot size and on the power of laser beam. An additional requirement is that the fluence at the markable material be below the ablation threshold for the markable material 18 so that the markable material 18 is not ablated. Therefore, the target material and/or markable material should be chosen such that their ablation thresholds are different, and should preferably be sufficiently different that this is readily achieved within the usual operating parameters of the irradiation source 10 and the focussing abilities of lens within the beam scanning device 16. Note that although in FIG. 1 the laser beam is shown as being focussed towards the surface of the target material 20, the optics in the beam scanning device 16 may alternatively be configured to focus and recollimate the beam within the device 16. It is the actual beam size at the target material that is important, so that the correct fluence is achieved.

The suitably focussed/collimated beam is directed towards the target material 20, and passes through the markable material 18 without damaging it (because the fluence is below the ablation threshold) and without being significantly absorbed (because the markable material 18 is transparent to the wavelength of the laser beam), before irradiating the target material 20. Because the fluence is above the target material ablation threshold, some of the target material 20 is ablated to form a plasma, and thrown away from the target material 20 towards the back surface 40 of the markable material 18. Plasma is a gas at high temperature and pressure comprising many tiny ionised particles. Some or all of the ablated material lands on the back surface 40 within the laser beam path. Hence the back surface 40 of the markable material 18 and the ablated material thereon are together subjected to the laser irradiation. The effect of the subjection to irradiation is to cause the materials to interact in a complex manner so that the surface material of the markable material 18 is modified by the ablated material becoming doped within the surface material. The plasma bombards the back surface 40 of the markable material 18, softening the glass and introducing minor defects. These surface changes allow the plasma particles of ablated material to become embedded in the back surface 40 so that the glass is modified. In addition, the modified glass ceases to be transparent to the laser irradiation and instead begins to absorb the irradiation. This enhances the interaction further. Therefore, a permanent mark is formed on the back surface 40 of the markable material 18.

The ablated material thrown off from the target material 20 has kinetic energy, which needs to be sufficient for the ablated material to travel sufficiently far to reach the back surface 40 of the markable material 18. Therefore, it is important that the spacing between the target material 20 and the markable material 18 is small enough for the ablated material to do this, otherwise marking will not occur.

The laser output is pulsed. Therefore, the markable material 18 is not continuously irradiated, so that if any absorption does occur, the heat deposited thereby is able to dissipate between pulses and does not cause any thermal damage to the markable material.

The pulse duration may be sufficiently long and/or the spacing sufficiently small that the ablation and the marking interaction can occur within a single pulse. This happens if the ablated material has time to travel to the back surface 40 before the tail end of the pulse has passed through the markable material 18, so that the irradiation necessary to cause the interaction is present as the ablated material arrives at the back surface 40. This can give good control over the marking process, as all ablated material interacts before more ablated material is deposited on top of it. However, satisfactory results can be obtained by using shorter pulses/larger spacings so that one pulse causes the ablation and a later pulse causes the interaction.

There are many parameters of the marking process which can be modified and, if desired, controlled by use of the controller 26. To achieve a desired printed or marked pattern on the markable material 18, such as a word, a logo, a picture, a drawing or a barcode, it is necessary to move the incoming beam and the markable material 18 relative to one another. This can be achieved by using the controller 26 to control the beam scanning device 16 so that the beam is moved over the surface of the markable material 18 to create the pattern. The controller 26 may be programmed to perform the necessary movements. Any suitable scanning action can be used. For example, the constituent parts of a pattern may be traced out one at a time, or the pattern may be built up line by line rastering the laser beam across the whole pattern. The beam scanning device 16 may be of any type suitable to provide the desired scanning movement. A particularly suitable device is a galvanometer scanner, in which the beam is directed by movable mirrors driven by galvanometer drivers. Galvanometer scanners provide fast, high precision and repeatable scanning of beams, and are widely available.

Alternatively, relative movement can be achieved by keeping the beam stationary, and moving the markable material 18 instead by means of moving the translation stage 24 under control of the controller 26. Also, the translation stage 24 can be used in conjunction with the beam scanning device 16 to mark large patterns on large samples of markable material 18.

In moving either the beam or the markable material 18 or both, it is of course essential that the target material 20 remains in the beam path so that material can be ablated to form the mark.

The laser fluence may be controlled by the controller 26 to ensure that it remains within the necessary boundaries of being below the ablation threshold for the markable material 18 but above the ablation threshold for the target material 20. If the fluence is too low, there will be no ablation to deposit material on the back surface 40 and hence no marking; if the fluence is too high the markable material 18 will be damaged by ablation and accompanying microcracking. The energy meter 14 can provide a continuous monitoring of the energy output of the irradiation source 10 and communicate it to the controller 26, which can alter the irradiation source output, and also be programmed with the energy output required to give the necessary fluence. Therefore, any fluctuations in the output of the irradiation source 10 can be corrected for quickly and automatically, so that the fluence can be maintained at the desired level.

The occurrence of the interaction and hence of marking can also be monitored and corrected for if necessary. The photodetector 28 is positioned to detect light which is scattered by and reflected from the upper surface of the target material 20, the back surface 40, and the ablated material both moving and deposited on the back surface 40. Measurements have shown that the amount of light detected as a function of time varies with the amount of ablated material which is deposited on the back surface 40; the shape of the function varies significantly between that for no deposited ablated material and that for deposited ablated material. The controller 26 receives the detected signal from the photodetector 28, and can be programmed to analyse the function to discriminate between the two cases. For example, integrating under the curve will give different results for the two cases. If the controller 26 recognises that little or no ablated material is reaching the back surface 40, it can take corrective action. By sending a signal along the connection 36, it adjusts the micrometer 22 so as to reduce the spacing between the target material 20 and the markable material 18 until the ablated material is able to reach the back surface 40. Alternatively or additionally, the controller 26 can increase the laser fluence; this imparts greater kinetic energy to the ablated material so that it can traverse the spacing. Therefore, the marking process can be controlled in real time. If desired, analysis of the function can also be performed in greater detail, so that the controller is able to monitor the amount or proportion of ablated material which is deposited.

Figure 2:
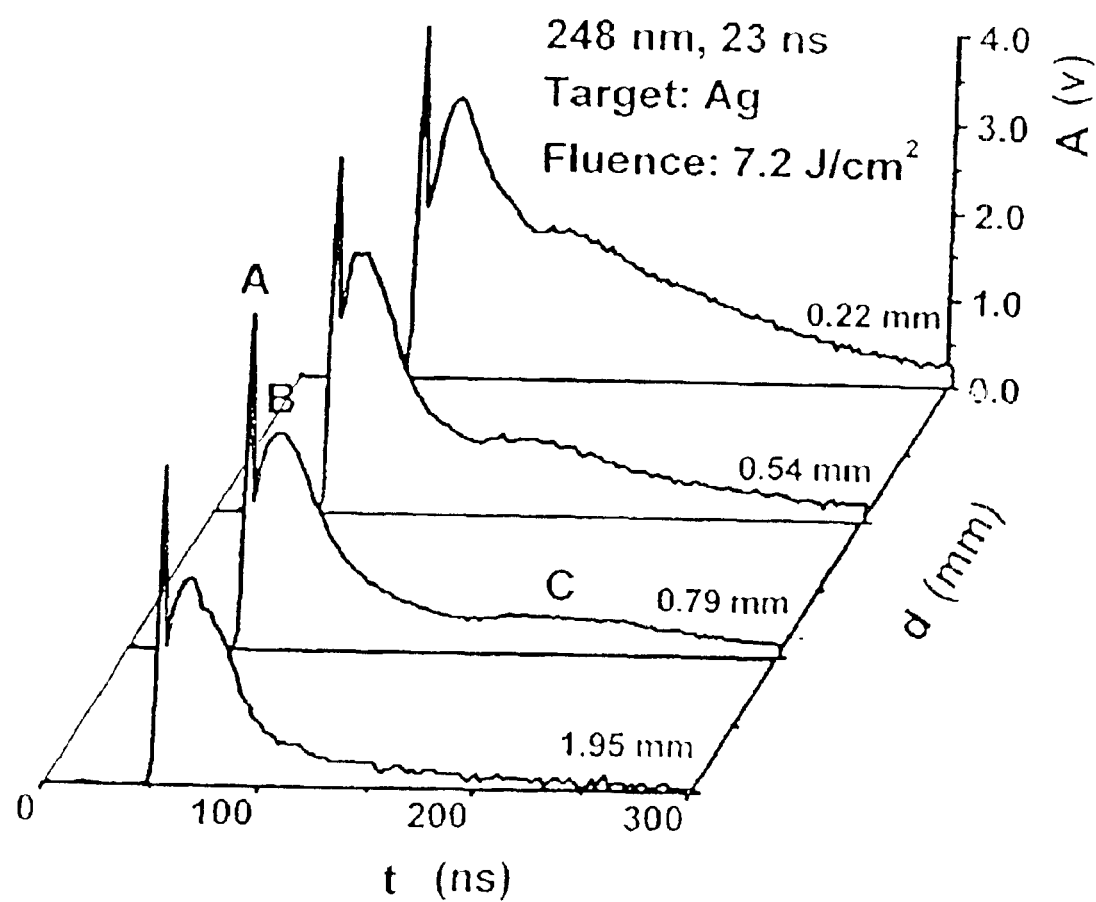
FIG. 2 shows examples of the response of a photodetector forming part of the apparatus of FIG. 1.

FIG. 2 shows recorded examples of time-resolved signals detected by the photodetector 28. The examples are shown as graphs of the variation of measured signal amplitude A with time t, for a range of spacings d. These results were obtained from the marking of a fused quartz substrate (the markable material) with a silver target. The laser wavelength was 248 nm, the pulse duration was 23 ns, and the laser fluence was 7.2 J/cm$^2$ (0.72 mJ/m$^2$). Graphs for spacings of 1.95 mm, 0.79 mm, 0.54 mm and 0.22 mm are shown. It is clear that the shape of the signal varies significantly with spacing. At large spacings, there are two initial peaks, followed by a rapid drop in the signal amplitude. At smaller spacings, the amplitude decreases much more slowly, which is evidence that light is being scattered and reflected from ablated material deposited on the back surface 40. The deposition of ablated material on the back surface 40 means that marking will occur.

Colour printing or marking can be achieved by use of different target materials. For example, copper gives red marks, silicon gives black marks, aluminium or silver give white marks, chromium gives yellow marks, titanium gives grey marks and tungsten gives blue marks. Other target materials can also be used to achieve these and other colours. It is a simple procedure to change the target material 20 without dismantling or reconfiguring the remainder of the apparatus, so that multi-colour printing of a single sample of markable material 18 can be readily achieved.

In addition to a range of colours, different tones can also be achieved. The tone of a mark depends on how much ablated material is deposited on the back surface 40 for interaction, so that a darker tone is obtained from more deposited ablated material. Therefore a simple way of marking in a darker tone is to keep both the beam and markable material 18 stationary, and allow the required amount of ablated material to accumulate over several pulses.

However, it is possible to achieve a higher degree of control than this. The ablated material is thrown off from the target material 20 with a range of kinetic energies, so that different particles of the ablated material can travel different distances. Therefore, if the spacing is very small, all the ablated material reaches the back surface 40. As the spacing is increased, the proportion of ablated material having sufficient kinetic energy to reach the back surface 40 reduces. Hence the tone of a mark can be altered by increasing or decreasing the spacing to give the desired amount of deposited ablated material, without the need for multiple pulses to be used at a single location. This speeds up the marking process. The spacing can be controlled by the controller 26, for example in response to signals from the photodetector.

A similar effect can be achieved by controlling the laser energy fluence instead of, or as well as, the spacing. A higher fluence imparts more kinetic energy to the ablated material, so that a larger proportion can reach the back surface 40 to form the mark, giving a deeper tone.

Figure 3:
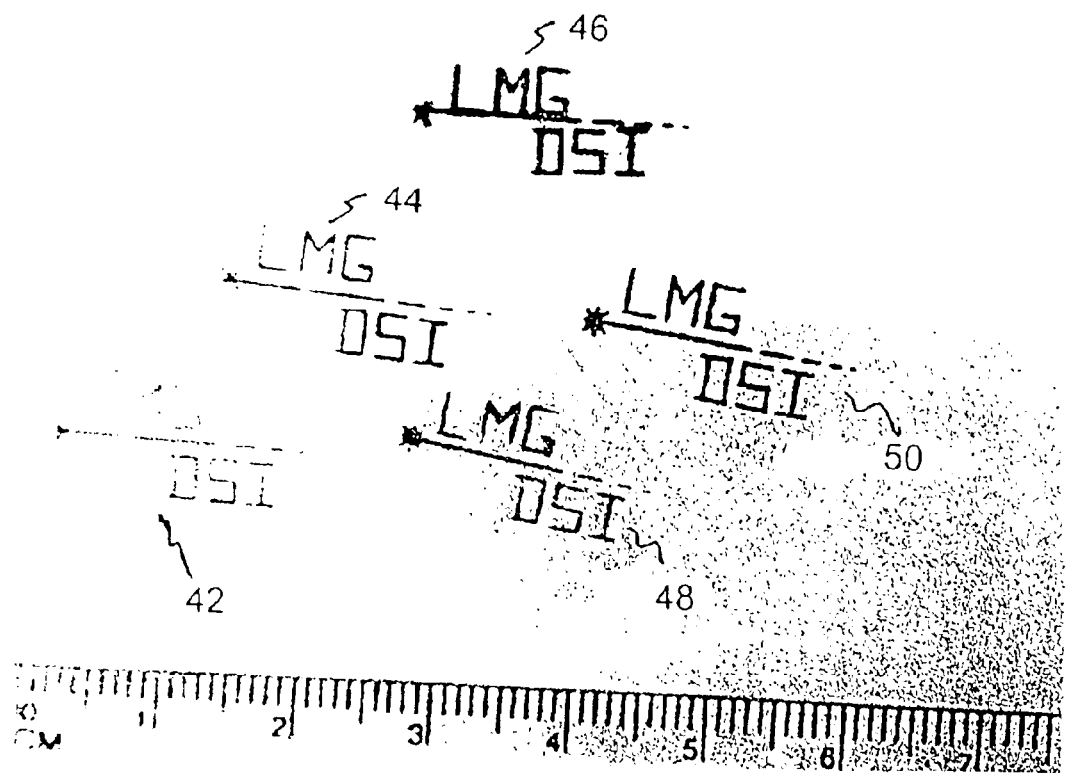
FIG. 3 shows examples of patterns marked on glass substrates using the apparatus of FIG. 1.

FIG. 3 shows examples of marks printed on glass by use of an embodiment of a method according to the present invention, demonstrating both different colours and different tones. Examples 42, 44 and 46 are patterns printed in red, and showing different tones, Example 42 being the lightest tone and Example 46 being the deepest tone. Examples 48 and 50 are patterns printed in black, with Example 48 having a lighter tone than example 50. A scale is included in the Figure (each small division being 1 mm) to indicate the high degree of detail, resolution and definition of the printing.

Figure 4A:
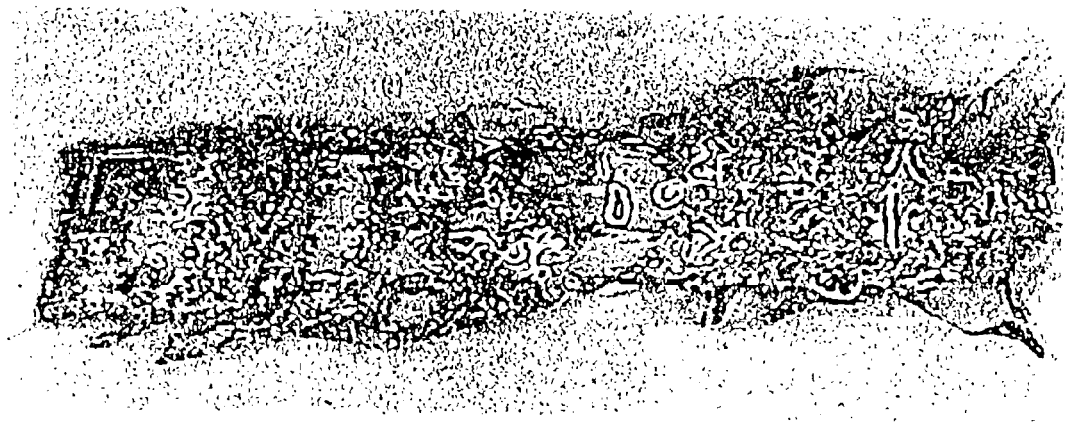
FIG. 4(a) shows an example of a pattern marked on glass using a conventional marking method.
Figure 4B:
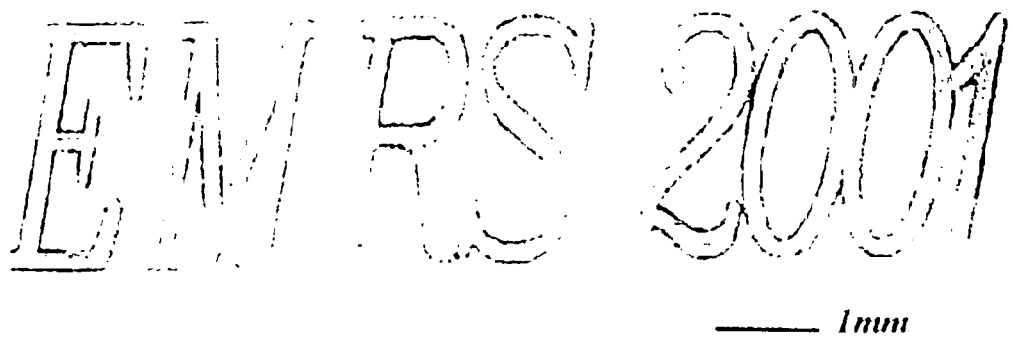
FIG. 4(b) shows the same pattern marked on glass using embodiments of a method and apparatus according to the present invention.
Figure 4C:
FIG. 4(c) shows a DSI logo, a Chinese poem, a picture of DSI Building and a drawing on the glass substrate using the apparatus of FIG. 1.
Figure 4C:
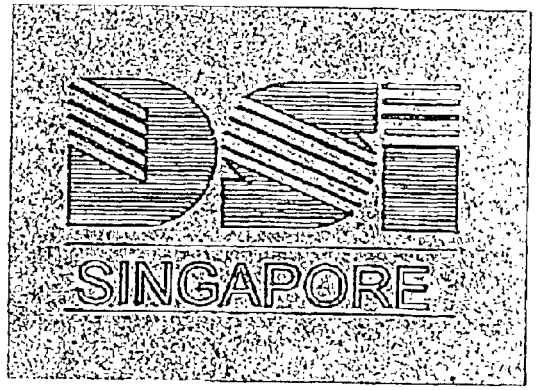
Figure 4C:
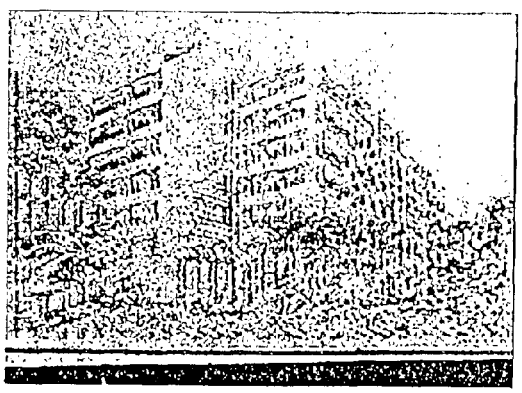
Figure 4C:

FIG. 4(b) shows a further example of a pattern printed on a glass substrate by use of an embodiment of a method according to the present invention, and indicates the high quality achievable. No microcracks or other damage are observable around the edges of the printed lines. The image is magnified, as indicated by the included scale. For the purposes of comparison, FIG. 4(a) shows the same pattern marked on a glass substrate by a conventional laser ablation technique. It is clearly evident that the laser ablation gives a very poor quality image, with much damage produced in the glass, in the form of microcracks caused by thermally-induced stresses. The laser ablation pattern of FIG. 4(a) was obtained with a laser fluence of 32 J/cm$^2$ (3.2 mJ/m$^2$) whereas the pattern of FIG. 4(b) was obtained with the much lower laser fluence of 2.5 J/cm$^2$ (0.25 mJ/m$^2$). FIG. 4(c) shows the images of the laser marking on the glass substrate for the logo, Chinese poem and picture and drawing. It was obtained by this technology with the properly selected of the processing parameters and related file convection from the digital image files to the vector files for the controlling of the galvanometer. Thus marking methods according to the present invention can be carried out with laser fluences an order of magnitude lower than those required for conventional techniques, making methods according to the present invention less costly and also safer. A Nd:YAG laser was used to produce both patterns.

Many irradiation sources are suitable for use in methods and apparatus according to embodiments of the present invention. Lasers offer convenient sources capable of delivering suitable fluence levels. Practically any wavelength from the ultraviolet to the infrared can be used, although the choice for a given printing process will depend on the materials used. For example, the wavelength must be one to which the markable material is substantially transparent if the arrangement depicted in FIG. 1 is to be used. As mentioned above, the use of pulses of irradiation is preferable, but marking may be achieved with continuous wave irradiation. The aforementioned nanosecond frequency-doubled diode-pumped Nd:YAG laser is an especially suitable source in terms of system reliability and cost.

The apparatus depicted in FIG. 1 may be modified to include more or fewer features. For example, alteration of the fluence and spacing may be performed manually, rather than being under the control of the controller, and may be done in response to readings from the energy meter and the photodetector, or may be in response to judgements of the marking process made by visual observation. If pulsed irradiation is used, it may be desirable to include some form of electronic triggering, possible with a delay line, so that the photodetector operates in synchronism with the marking, and permitting only preselected relevant parts of the detected signal to be analysed. Other detectors and meters can be included to monitor other parameters, such as, for example, the wavelength of the irradiation source (particularly relevant if a tunable source is used).

Alternative arrangements of the markable material, the target material and the irradiation beam direction can be used. These may allow the method to be applied to the marking of non-transparent materials. For example, irradiation may be directed onto the target material at an oblique angle so that it can pass between the markable material and the target material instead of passing through the markable material. A second beam of irradiation can then be used to subject the surface of the markable material to irradiation. Two separate beams may also be used if it is found that for a particular combination of target material and markable material the ablation and interaction can be best achieved with different wavelengths or fluences.

In the foregoing description, the term "markable materials" is intended to mean any material which is capable of being marked by means of methods falling within the scope of the present invention. Although the method is especially relevant to transparent hard materials such as glass, it may also be applied to other hard materials which may be prone to microcracking, such as opaque glasses and ceramics, and indeed to any material which can be marked by the interaction between deposited ablated material and surface material when subjected to relevant irradiation. The term "transparent" is to be understood to describe a material which transmits a sufficient quantity of the incoming irradiation to the target material underneath to cause adequate ablation of that target material, preferably without causing undue damage to the transparent material. The term "hard" is intended to describe a material which has a high level of hardness, is brittle and prone to microcracking.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims may be formulated to such features during the prosecution of this application or of any such further application derived therefrom. In particular, with reference to the appended claims, features from dependent claims may be combined with those of the independent claims and features from respective independent claims may be combined in any appropriate manner and not merely in the specific combinations enumerated in the claims.

In view of the foregoing description it will be evident to a person skilled in the art that various modifications may be made within the scope of the invention.

For the avoidance of doubt, the term "comprising" is not limited to meaning "consisting only of".

What is claimed is:

1. A method of laser marking comprising:
   arranging a sample of target material spaced apart from a sample of markable material;
   directing irradiation having an energy fluence above the ablation threshold of the target material onto the target material such that at least some of the target material is ablated and thrown onto a surface of the markable material;
   subjecting said surface of the markable material to irradiation having an energy fluence below the ablation threshold of the markable material to induce a doping interaction between the ablated material and the surface which marks the surface with the ablated material; and
   detecting and analyzing the amount of irradiation reflected and scattered from the surface, the target material and the ablated material.

2. A method of laser marking according to claim 1, in which the markable material is arranged with respect to the target material such that the irradiation is directed via the markable material and onto the target material.

3. A method of laser marking according to claim 2, in which the markable material is substantially transparent to the irradiation.

4. A method of laser marking according to claim 1, in which the irradiation is provided as a train of pulses.

5. A method of laser marking according to claim 4, in which the ablation and the interaction are achieved by the same pulse of irradiation.

6. A method of laser marking according to claim 4, in which the ablation and the doping interaction are achieved by different pulses of irradiation.

7. A method of laser marking according to claim 1, in which the method further comprises monitoring the fluence of the irradiation.

8. A method of laser marking according to claim 7, in which the method further comprises controlling the fluence of the irradiation in response to the monitoring.

9. A method of laser marking according to claim 1, in which the irradiation is optical irradiation.

10. A method of laser marking according to claim 1, in which the method further comprises adjusting the spacing between the target material and the markable material in response to the analysis of the reflected and scattered irradiation to determine that the ablated material is being thrown onto the surface of the markable material.

11. A method of laser marking according to claim 1, in which the method further comprises setting the spacing between the target material and the markable material so that the amount of ablated material thrown onto the surface of the markable material is sufficient to mark the surface with a mark of a desired tone.

12. A method of laser marking according to claim 1, in which the method further comprises setting the fluence of the irradiation so that the amount of target material which is ablated and thrown onto the surface of the markable material is sufficient to mark the surface with a mark of a desired tone.

13. A method of laser marking according to claim 1, in which the method further comprises moving the directed irradiation and the sample of markable material relative to one another so as to mark the surface of the markable material in accordance with a desired pattern.

14. A method of laser marking in accordance with claim 1, in which the target material is one of copper, silicon, aluminium, silver, chromium, titanium, tungsten and other metal, semiconductor or other solid substrates.

15. Apparatus for laser marking a sample of markable material, comprising:
   a sample of target material;
   a irradiation source operable to generate irradiation to:
      ablate at least part of the target material so that the ablated material is thrown onto the surface of a sample of markable material spaced apart from the sample of target material; and
      irradiate the surface of the sample of the markable material to induce a doping interaction between the ablated material and the surface which marks the surface with the ablated material; and
   a detector operable to detect irradiation scattered and reflected from the surface of the markable material, the target material and the ablated material and pass a detection signal to a controller, the controller being operable to control an adjustable mount in response to the detection signal.

16. Apparatus for laser marking according to claim 15, and further comprising a controller operable to control at least the operation of the irradiation source.

17. Apparatus for laser marking according to claim 16, and further comprising scanning apparatus controlled by the controller and operable to provide relative movement between the irradiation and the sample of markable material so that the surface can be marked in accordance with a desired pattern.

18. Apparatus for laser marking according to claim 17, in which the scanning apparatus comprises a galvanometer-based beam scanner operable to scan the irradiation.

19. Apparatus for laser marking according to claim 15, and further comprising scanning apparatus controlled by the controller and operable to provide relative movement between the irradiation and the sample of markable material so that the surface can be marked in accordance with a desired pattern.

20. Apparatus for laser marking according to claim 19, in which the scanning apparatus comprises a galvanometer-based beam scanner operable to scan the irradiation.

21. Apparatus for laser marking according to claim 15, in which the irradiation source is operable to generate optical irradiation.

22. Apparatus for laser marking according to claim 15, and further comprising an energy meter operable to measure the energy of the irradiation and pass the measurements to a controller, the controller being operable to control the irradiation source in response to the measurements.

23. Apparatus for laser marking according to claim 15, wherein the adjustable mount is operable to adjust the spacing between the sample of target material and the sample of markable material.

* * * * *